(12) United States Patent
Chereson

(10) Patent No.: US 6,822,845 B2
(45) Date of Patent: Nov. 23, 2004

(54) LOW PROFILE FILTER

(75) Inventor: Jeffrey D. Chereson, Erie, PA (US)

(73) Assignee: Spectrum Control, Inc., Fairview, PA (US)

(*) Notice: Subject to any disclaimer, the term of this patent is extended or adjusted under 35 U.S.C. 154(b) by 0 days.

(21) Appl. No.: 10/692,131

(22) Filed: Oct. 23, 2003

(65) Prior Publication Data

US 2004/0084199 A1 May 6, 2004

Related U.S. Application Data

(60) Provisional application No. 60/420,532, filed on Oct. 23, 2002.

(51) Int. Cl.⁷ .................................................. H01G 4/35
(52) U.S. Cl. ..................... 361/302; 361/306.1; 361/328; 333/182
(58) Field of Search .............................. 361/302, 303, 361/306.1, 306.3, 328, 329, 330; 333/182–185; 29/25.41, 25.42

(56) References Cited

U.S. PATENT DOCUMENTS

| | | | |
|---|---|---|---|
| 3,688,224 A | | 8/1972 | Suetake et al. |
| 4,148,003 A | * | 4/1979 | Colburn et al. ............. 333/181 |
| 4,187,481 A | | 2/1980 | Boutros |
| 4,744,000 A | | 5/1988 | Mason et al. |
| 4,753,611 A | | 6/1988 | Kobler |
| 5,039,965 A | * | 8/1991 | Higgins, Jr. ................ 333/182 |
| 5,177,663 A | | 1/1993 | Ingleson et al. |
| 5,286,221 A | | 2/1994 | Fencl et al. |
| 5,331,505 A | | 7/1994 | Wilheim |
| 5,367,956 A | | 11/1994 | Fogle, Jr. |
| 5,413,504 A | | 5/1995 | Kloecker et al. |
| 5,415,569 A | | 5/1995 | Colleran et al. |
| 5,905,627 A | * | 5/1999 | Brendel et al. ............. 361/302 |
| 5,909,350 A | | 6/1999 | Anthony |
| 5,973,906 A | * | 10/1999 | Stevenson et al. .......... 361/302 |
| 5,994,975 A | | 11/1999 | Allen et al. |
| 6,018,448 A | | 1/2000 | Anthony |
| 6,218,913 B1 | | 4/2001 | Pagenkopf |
| 6,275,369 B1 | | 8/2001 | Stevenson et al. |
| 6,424,234 B1 | | 7/2002 | Stevenson |
| 6,456,481 B1 | | 9/2002 | Stevenson |
| 2001/0050837 A1 | | 12/2001 | Stevenson et al. |
| 2002/0053298 A1 | | 5/2002 | Fogle, Jr. |
| 2003/0081370 A1 | | 5/2003 | Haskell et al. |

* cited by examiner

Primary Examiner—Anthony Dinkins
(74) Attorney, Agent, or Firm—Hodgson Russ LLP

(57) ABSTRACT

The invention may be embodied in an electromagnetic filter for use with a feedthrough conductor. An inductor having a metallized surface is disposed about the conductor, and a capacitor is joined to the inductor. One set of capacitor plates are electrically connected to a first conductive contact to provide a connection to the metallized surface. Another set of capacitor plates are electrically connected to a second conductive contact to provide a connection to the feedthrough conductor. A method of providing such a filter is also disclosed.

18 Claims, 4 Drawing Sheets

LOW PROFILE FILTER

CROSS-REFERENCE TO RELATED APPLICATION

This application claims the benefit of priority to U.S. provisional patent application Ser. No. 60/420,532, filed on Oct. 23, 2002, now pending.

FIELD OF THE INVENTION

The present invention relates to electromagnetic filters and methods of providing electromagnetic filters.

BACKGROUND OF THE INVENTION

It is known in the prior art to use an inductor and a capacitor circumferentially disposed about a feedthrough conductor in order to filter unwanted electromagnetic energy from a signal being carried by the conductor. In some prior art devices, the capacitor is circumferentially disposed about the inductor, and the inductor is circumferentially disposed about the conductor. Such an arrangement provides a compact filter, but the electromagnetic characteristics of that filter may be dictated by the reactance intrinsic to the ground design.

Also in the prior art is the use of discoidal capacitors, circumferentially disposed about a feedthrough conductor. When used in combination with an inductor, the discoidal capacitors are set apart from the inductor, and this increases the size of the electromagnetic filter.

SUMMARY OF THE INVENTION

The invention may be embodied in an electromagnetic filter for use with a feedthrough conductor. An inductor having a metallized surface is disposed about the conductor, and a capacitor is joined to the inductor. A first conductive contact electrically connects one set of capacitor plates to the metallized surface and a second conductive contact electrically connects another set of capacitor plates to the feedthrough conductor.

The invention may be embodied in a method of providing an electromagnetic filter. An inductor may be provided, and coated to provide a metallized surface. A capacitor is electrically connected to a first conductive contact and a second conductive contact. The capacitor may be joined to the inductor and the first conductive contact may be electrically connected to the metallized surface. The second conductive contact may be joined to the feedthrough conductor.

BRIEF DESCRIPTION OF THE DRAWINGS

For a fuller understanding of the nature and objects of the invention, reference should be made to the following detailed description taken in conjunction with the accompanying drawings, in which.

DETAILED DESCRIPTION OF THE INVENTION

Figure 1:
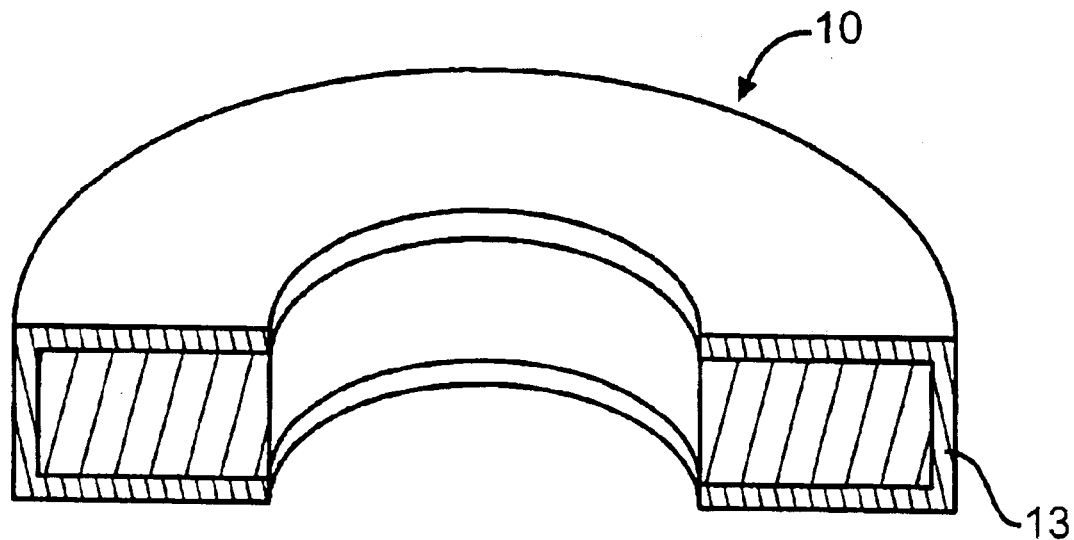
FIG. 1 is a cross-sectioned perspective view of a metallized inductor according to the invention.
Figure 2:
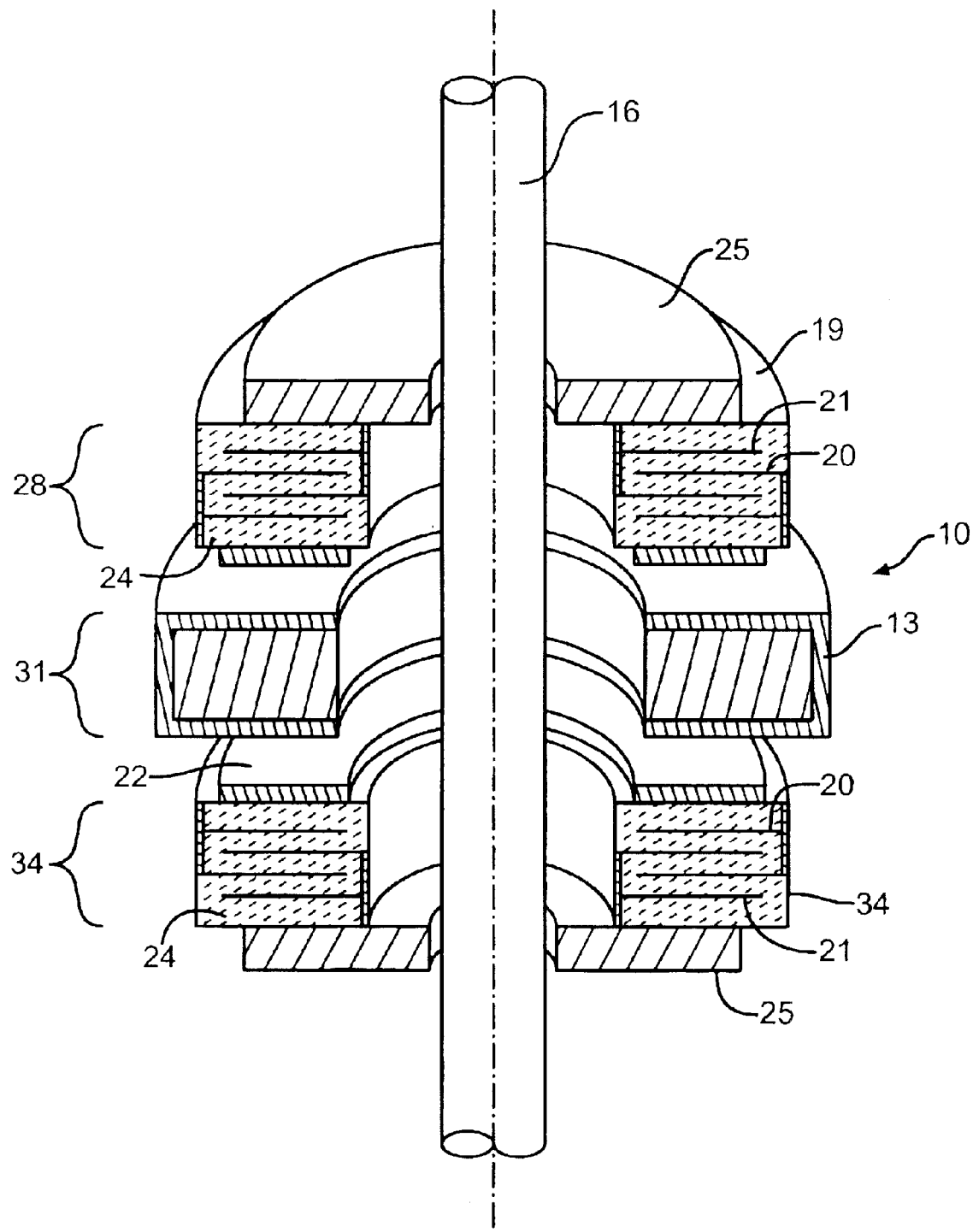
FIG. 2 is a partially cross-sectioned perspective view of an electromagnetic filter according to the invention.
Figure 3:
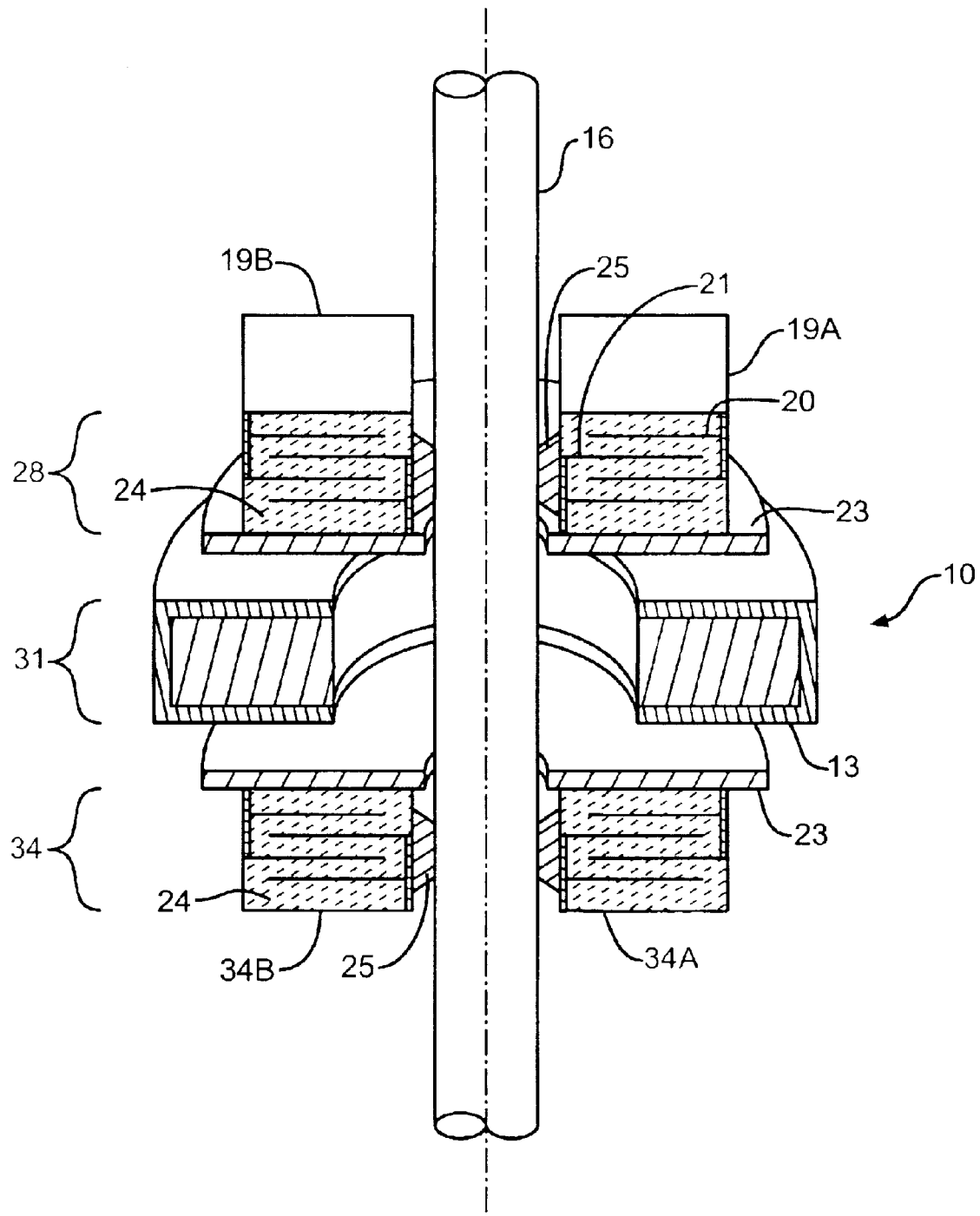
FIG. 3 is partially cross-sectioned perspective view of an electromagnetic filter according to the invention.
Figure 4:
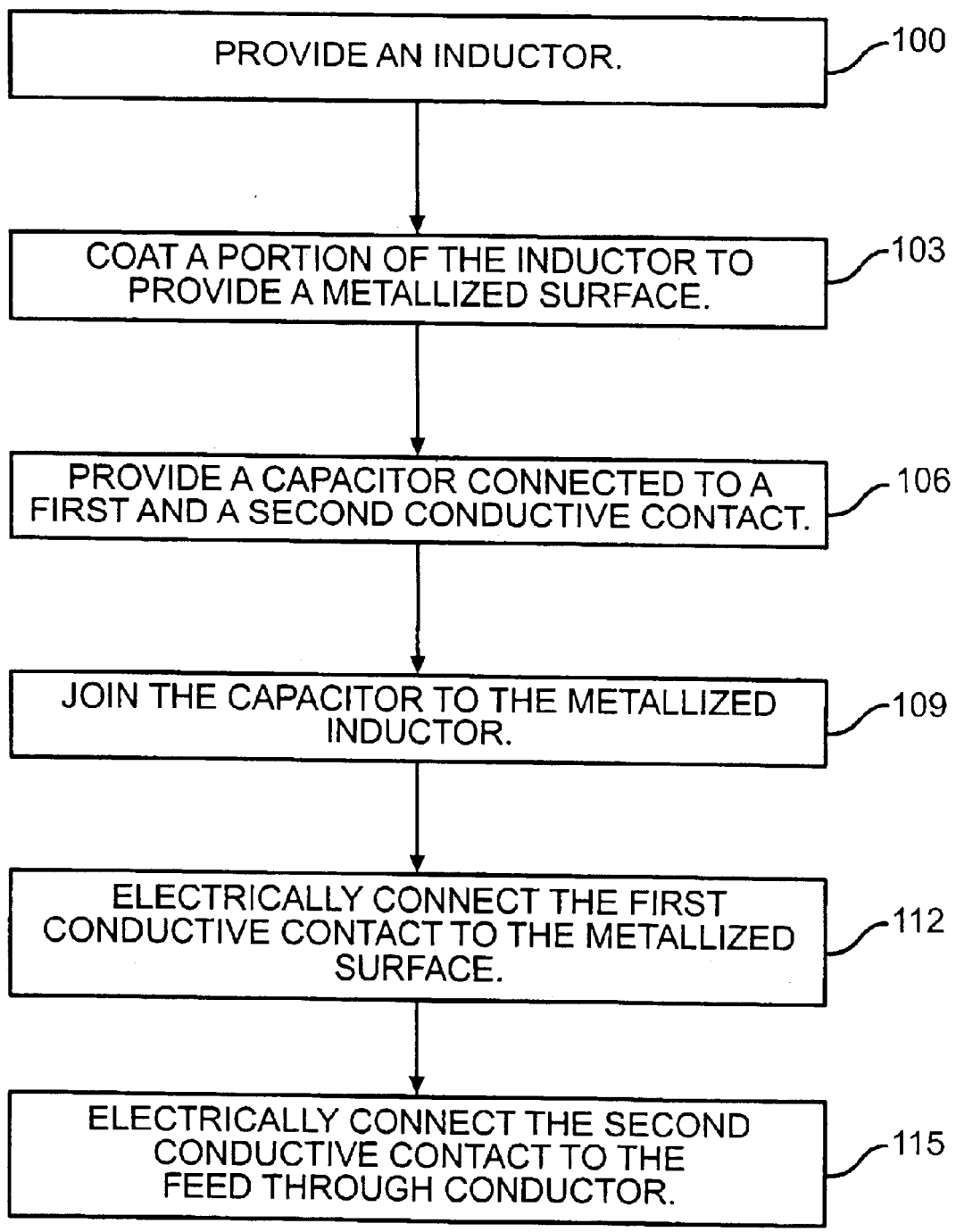
FIG. 4 is a flow chart depicting a method according to the invention.

The invention may be embodied as an electromagnetic filter. FIG. 1 shows an inductor 10 with a metallized surface 13. As shown in FIGS. 2 and 3, the inductor 10 may be disposed about a feedthrough conductor 16. The metallized surface 13 may be formed by electroplating the inductor 10. The metallized surface 13 may be at a first electric potential and the conductor 16 may be at a second electric potential. It should be noted that for the inductor 10, the metallized surface 13 does not extend so as to be positioned between the feedthrough conductor 16 and the inductor 10.

A capacitor 19 may be joined to the inductor 10 so as to fix the position of the capacitor 19 relative to the inductor 10. The metallized surface 13 may be used to join the capacitor 19 to the inductor 10. However, a non-metallic material may be used to join the capacitor 19 to the inductor 10.

The capacitor 19 may have a first plate 20 and a second plate 21. A first conductive contact 22 may electrically connect the metallized surface 13 to the first plate 20. The capacitor 19 may also have a dielectric material 24, which separates the plates 20, 21. A second conductive contact 25 may electrically connect the feedthrough conductor 16 and the second plate 21. The metallized surface 13 may be associated with a first electric potential, for example ground, and the second conductive contact 25 may be electrically connected to the feedthrough conductor 16. In this manner, a pi filter may be provided. By placing the ground on the inductor, additional parasitics may be eliminated.

The capacitor 19 may be positioned so as not to be disposed about the inductor 10. Instead, the capacitor 19 may be disposed about the feedthrough conductor 16 at a first axial location 28 of the feedthrough conductor 16, while the inductor 10 is disposed about a second axial location 31 of feedthrough conductor 16. In FIGS. 2 and 3, the first axial location 28 is shown being different from the second axial location 31. An additional capacitor 34 may be joined to the metallized surface 13 of the inductor 10, and the additional capacitor 34 may be positioned at a third axial location 34. Both capacitors 19, 34 may be positioned at axial locations of the feedthrough conductor 16 that are different from the axial location of the inductor 10. For example, the capacitors 19, 34 may have axial locations that result in the inductor 10 being positioned axially between the capacitors 19, 34.

FIG. 2 shows that the capacitors 19, 34 may each be a single capacitor circumferentially disposed about the feedthrough conductor 16. As shown in FIG. 3, in lieu of a single circumferentially disposed capacitor 19, two or more discrete capacitors 19A, 19B maybe positioned around the feedthrough conductor 16, each discrete capacitor 19A, 19B being positioned at an axial location different from the axial location of the inductor 10. Further, in lieu of a single circumferentially disposed additional capacitor 34, two or more discrete capacitors 34A, 134B may be positioned around the feedthrough conductor 16, each discrete capacitor 34A, 34B being positioned at an axial location different from the axial location of the inductor 10. The capacitors 19A, 19B, 34A, 34B may be joined to a substrate 23, which in turn may be joined to the inductor 10.

The invention also includes a method of providing an electromagnetic filter. In such a method, an inductor is provided 100 and a portion of the inductor is coated 103 to provide a metallized surface on the inductor. The metallized surface may be provided by electroplating the inductor 10. A capacitor is provided 106, and electrically connected to a first conductive contact and a second conductive contact. The first conductive contact may be associated with a first plate and the second conductive contact may be associated with a second plate, the plates being separated by a dielectric material. The capacitor may be joined 109 to the metallized inductor, and the first conductive contact may be electrically connected 112 to the metallized surface. The electrical connection between the first conductive contact and the metallized surface may be provided by soldering. The second conductive contact is electrically connected 115 to the feedthrough conductor. The electrical connection between the second conductive contact and the feedthrough may be provided by soldering.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An electromagnetic filter comprising:
    a feedthrough conductor;
    an inductor disposed about the conductor and having a metallized surface;
    a capacitor joined to the inductor, the capacitor being electrically connected to a first conductive contact which is electrically connected to the metallized surface, and the capacitor being electrically connected to a second conductive contact which is electrically connected to the feedthrough conductor.

2. The filter of claim 1, wherein the capacitor is disposed about the feedthrough conductor.

3. The filter of claim 2, wherein the capacitor is not disposed about the inductor.

4. The filter of claim 3, wherein the capacitor is disposed about a first axial location of the feedthrough conductor and the inductor is disposed about a second axial location of the feedthrough conductor, the first axial location being different from the second axial location.

5. The filter of claim 1, wherein the metallized surface joins the capacitor to the inductor.

6. The filter of claim 1, further comprising a non-metallic material joining the capacitor to the inductor.

7. The filter of claim 1, wherein the metallized surface is not positioned between the feedthrough conductor and the inductor.

8. The filter of claim 1, wherein the metallized surface is at a first electric potential and the conductor is at a second electric potential.

9. The filter of claim 1, further comprising at least one additional capacitor joined to the inductor, wherein both capacitors are disposed about a first axial location of the feedthrough conductor.

10. A pi-filter, comprising:
    a first capacitor disposed about a conductor;
    an inductor disposed about the conductor and joined to the first capacitor, the inductor having at least one metallized surface electrically connected to the first capacitor,
    a second capacitor disposed about the conductor and joined to the inductor.

11. The pi-filter of claim 10, wherein first capacitor is at a first axial location with respect to the feedthrough conductor, the inductor is at a second axial location with respect to the feedthrough conductor, the second capacitor is at a third axial location with respect to the feedthrough conductor, and the second axial location is between the first and third axial locations.

12. The pi-filter of claim 10, wherein the metallized surface joins the first capacitor and the inductor.

13. The pi-filter of claim 10, wherein the second capacitor is electrically connected to the metallized surface.

14. The pi-filter of claim 10, further comprising a second metallized surface joined to the second capacitor.

15. The pi-filter of claim 10, wherein neither capacitor is disposed about the inductor.

16. The pi-filter of claim 10, wherein the metallized surface is not positioned between the feedthrough conductor and the inductor.

17. The pi-filter of claim 10, wherein the metallized surface is at a first electric potential and the conductor is at a second electric potential.

18. A method of providing an electromagnetic filter, comprising:
    providing an inductor;
    coating a portion of the inductor to provide a metallized surface on the inductor;
    providing a capacitor that is electrically connected to a first conductive contact and a second conductive contact;
    joining the capacitor to the inductor;
    electrically connecting the first conductive contact to the metallized surface
    electrically connecting the second conductive contact to the feedthrough conductor.

* * * * *